US006617567B2

(12) United States Patent
Mukherjee et al.

(10) Patent No.: US 6,617,567 B2
(45) Date of Patent: Sep. 9, 2003

(54) ANALOG PRE-PROCESSOR WITH IMPROVED INPUT COMMON MODE RANGE

(75) Inventors: Subhashish Mukherjee, Bangalore (IN); Visvesvaraya Pentakota, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/888,201

(22) Filed: Jun. 22, 2001

(65) Prior Publication Data

US 2003/0001075 A1 Jan. 2, 2003

(51) Int. Cl.$^7$ ................................................. H01J 40/14
(52) U.S. Cl. ................................... 250/214 A; 348/300
(58) Field of Search ....................... 250/214 A, 214 LS, 250/214 DL, 214.1, 214 AG; 348/300, 302

(56) References Cited

U.S. PATENT DOCUMENTS

| 4,692,618 A | * | 9/1987 | Klatt | .......................... 250/330 |
|---|---|---|---|---|
| 4,940,895 A | * | 7/1990 | Mansfield | ..................... 250/332 |
| 5,444,413 A | * | 8/1995 | Kimura et al. | ............... 327/562 |
| 5,574,678 A | * | 11/1996 | Gorecki | ........................ 708/801 |
| 5,914,633 A | * | 6/1999 | Comino et al. | .............. 327/552 |
| 5,982,424 A | * | 11/1999 | Simerly et al. | ........... 348/229.1 |
| 6,014,097 A | * | 1/2000 | Brandt | ......................... 341/156 |
| 6,025,875 A | * | 2/2000 | Vu et al. | ....................... 327/90 |
| 6,400,301 B1 | * | 6/2002 | Kulhalli et al. | .............. 341/155 |
| 6,437,824 B1 | * | 8/2002 | Suzuki et al. | ................ 348/222 |

* cited by examiner

Primary Examiner—David Porta
Assistant Examiner—Stephen Yam
(74) Attorney, Agent, or Firm—J. Dennis Moore; W. James Brady, III; Frederick J. Telecky, Jr.

(57) ABSTRACT

An analog circuit 20 includes an amplifier 30 with a positive input node, a negative input node, a positive output node and a negative output node. A first capacitor 32 is coupled between the negative input node and an analog signal node. A second capacitor 34 is coupled between the positive input node and a reference voltage node. In addition, a third capacitor 36 is coupled between the positive input node and the negative output node and a fourth capacitor 38 is coupled between the negative input node and the positive output node. A first switch 40 is coupled between the third capacitor 36 and the negative output node and a second switch 42 is coupled between the fourth capacitor 38 and the positive output node. An inverter coupled to the analog signal node drives common mode capacitors coupled between the output of the inverter and the respective negative and positive input nodes.

1 Claim, 5 Drawing Sheets

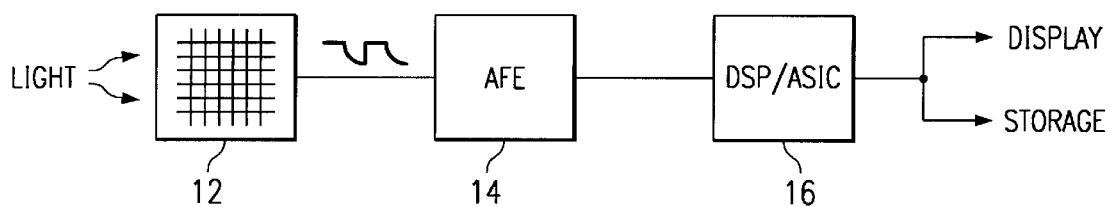
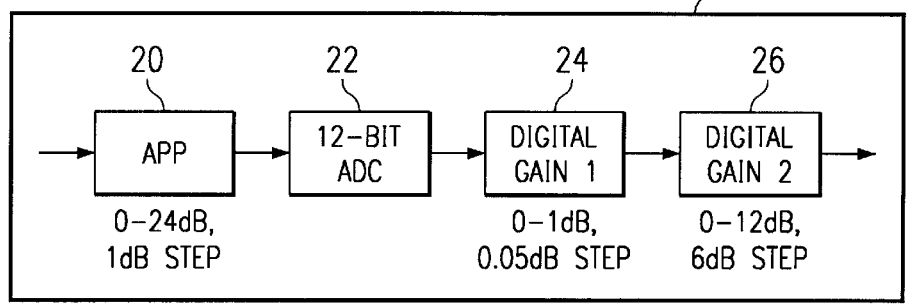
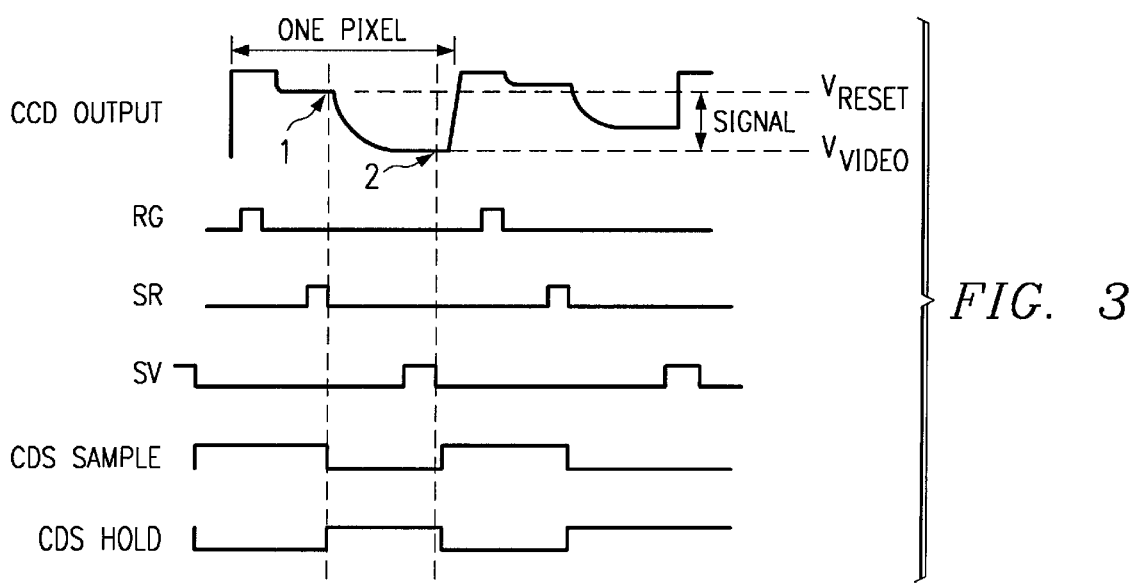

ANALOG PRE-PROCESSOR WITH IMPROVED INPUT COMMON MODE RANGE

FIELD OF THE INVENTION

This invention relates generally to electronic circuits and specifically to an analog pre-processor that can be used with a digital imaging device.

BACKGROUND OF THE INVENTION

Digital cameras are fast replacing film based cameras as a medium to capture and store images. In a digital camera, a light sensor converts the incident light into voltage. The analog front end (AFE) first processes the signal to improve dynamic range and subsequently digitizes this voltage. The digital output is then processed further and stored so it can be viewed in various forms.

The main thrust in digital camera research is to improve picture quality and reduce power. The analog front end is one of the key blocks which determines the overall accuracy and power of the camera system. The AFE can be conceptually divided into two parts, the analog signal processing section (referred to here as the analog pre-processor or APP) followed by a digitizer (e.g., an analog-to-digital converter or ADC).

For hand-held digital cameras and camcorders, a significant performance criteria is power, for a given accuracy. Camera vendors are looking for very low power twelve-bit analog front ends. For example, one goal is to produce sub-80 mW AFEs. This goal represents a power reduction of about one third compared to commercially available devices.

SUMMARY OF THE INVENTION

In one aspect, the present invention provides an analog pre-processor that achieves both low power and high accuracy. For example, the preferred embodiment provides a single operational amplifier (op amp) based architecture that minimizes analog power as well as provides optimum noise and linearity. This device is followed by a very low power twelve-bit analog to digital converter to complete the front end.

The present invention is useful in a number of applications including in a digital imaging device such as a digital camera or camcorder. This application might include a light sensor such as a charge coupled device (CCD) or a CMOS integrated sensor (CIS). Electrical signals corresponding to received light is provided to an analog pre-processor. In the preferred embodiment, the analog pre-processor includes a single amplifier. After the pre-processing, the signal can be converted to a digital signal and further processed prior to being displayed and/or stored.

In a more specific embodiment, the analog pre-processor is an analog circuit that includes an amplifier with a positive input node, a negative input node, a positive output node and a negative output node. A first variable capacitor is coupled between the positive input node and an analog signal node. A second variable capacitor is coupled between the negative input node and a reference voltage node. In addition, a third variable capacitor is coupled between the positive input node and the negative output node and a fourth variable capacitor is coupled between the negative input node and the positive output node. A first switch is coupled between the third variable capacitor and the negative output node and a second switch is coupled between the fourth variable capacitor and the positive output node.

The preferred embodiment includes a number of advantages over alternative solutions. For example, the pre-processor utilizes very little power. This low power is accomplished while maintaining good PGA (programmable gain amplifier) linearity. In addition, the noise is comparable or better than other twelve-bit parts.

BRIEF DESCRIPTION OF THE DRAWINGS

The above features of the present invention will be more clearly understood from consideration of the following descriptions in connection with accompanying drawings in which:

FIG. 1 is a block diagram of an exemplary digital imaging device;

FIG. 2 is a block diagram illustrating the gain distribution of a preferred analog front end;

FIG. 3 shows the timing of an exemplary CCD input;

DETAILED DESCRIPTION OF ILLUSTRATIVE EMBODIMENTS

Figure 4:
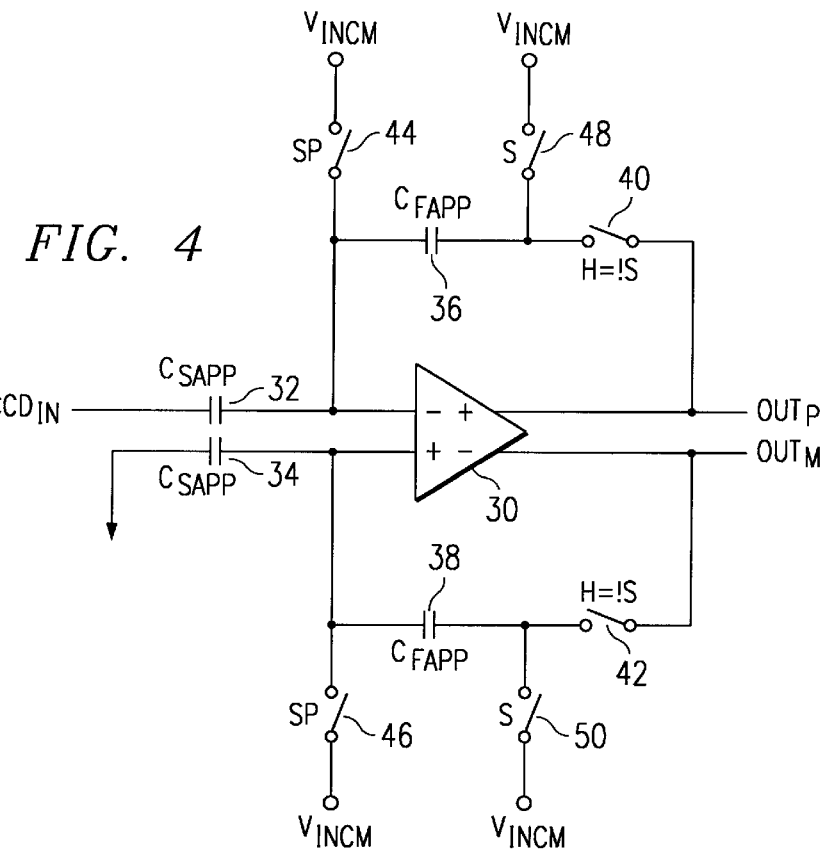
FIG. 4 shows a first embodiment analog pre-processor.

The making and use of the various embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not limit the scope of the invention.

The present invention will be described in the context of a digital imaging device, such as a digital camera. Accordingly, a system will first be described followed by a very specific implementation of the system. It should be understood that the present invention is not limited to the specific implementation described here.

FIG. 1 illustrates a block diagram of a digital imaging device 10 such as a digital camera (moving or still). A light sensor 12 receives incoming light. In the preferred embodiment, the light sensor includes a matrix array (e.g., provided in rows and columns) of light sensing units. The light sensor can convert two-dimensional incident light into voltage signals. In the preferred embodiment, these voltage signals are output in a serial fashion so that each pixel received by the sensor is output. The preferred embodiment utilizes a charge coupled device (CCD). One such commercially available CCD is the ICX2882AQ manufactured by Sony. Other embodiments may use other light sensors, such as a CMOS integrated sensor, as an example.

The analog output of the light sensor is provided to an analog front end (AFE) 14. The analog front end, which will be discussed in greater detail below, processes the analog signal and provides a digital output. The digital output can be provided to a digital processing circuit 16 such as a digital signal processor (DSP) or an application specific integrated circuit (ASIC), which can optionally perform further signal processing. As an example, a preferred embodiment implementation can include a DSP manufactured by Texas Instruments Incorporated. Representations of the light image can then be provided to a storage device (e.g., video tape, EEPROM, magnetic disk, optical disk), a display (e.g., liquid crystal display or LCD, cathode ray tube or CRT), or other destination such as a communication port for transmission. As examples, the output of the camera can be sent to a computer, a storage media, a printer, a display, a network, or a recorder.

The AFE 14 can be conceptually divided into two parts, the analog signal processing section (referred to here as the analog pre-processor or APP) followed by a digitizer (e.g., an analog-to-digital converter or ADC). In the preferred embodiment, the APP should be able to perform the following functions, among other things:

Correlated Double Sampling (CDS)
Programmable Gain Amplification (PGA)
Single ended to differential conversion
Level Shifting
Offset cancellation It is understood, however, that an apparatus or method that provides fewer than all of these features (or even none of the features) can still include the inventive concepts as disclosed herein.

In many applications, the main performance criteria for the AFE are low noise and low power, which, in the case of a digital camera, lead to improved picture quality and longer battery life. It has been perceived that there is a big market for a twelve-bit, 21 MSPS (mega samples per second), sub 80 mW AFE for digital still cameras. In this respect, the present invention has been utilized in a digital still camera front-end chip (TAFE1221) that can achieve a power of 65 mW. The noise performance is also comparable or better than other twelve bit parts. The following paragraphs discuss the design challenges and problems solved to achieve the above.

Low power can be achieved by designing a low power ADC and a low power APP section. In the preferred implementation, one goal of the APP is to provide 36 dB of gain at a step size of 0.05 dB along with correlated double sampling and single ended to differential conversion. These goals have been conventionally implemented using several cascaded stages built around operation amplifiers (OPAMPs), which leads to high power and noise. In the preferred implementation design, on the other hand, the entire APP functionality has been implemented using a single OPAMP stage. This approach uses minimum power and also minimizes channel noise.

FIG. 2 illustrates a block diagram of an AFE 14 than can achieve this goal. In this design, the APP 20 has been designed to provide 0 to 24 dB of gain at 1 dB step. After the signal has been digitized by ADC 22, a digital multiplier 24 provides the finer step of 0.05 dB with a range of 1 dB. Another crude digital gain block 26 provides the remaining 12 dB gain at a step of 6 dB. It can be shown that this configuration provides adequate noise performance for a twelve-bit system.

FIG. 3 shows the signal input from the light sensor 12 to the analog front end 14. In this example, the light sensor is a CCD. The first line, labeled CCD output, shows a typical CCD output waveform. The CCD output is reset to a fixed voltage (most positive in the waveform). Then the reset switch (shown and described in more detail with respect to FIG. 4) is opened (at the falling edge of signal SR) and subsequently the signal becomes available (at the falling edge of signal SV). The signals SR and SV are usually generated by a timing chip which controls both the CCD and AFE. The CCD voltage levels are of the order of 10 volts or more. Due to this, capacitive coupling (e.g., clamping) between the CCD chip and the AFE chip is preferably utilized.

In order to achieve correlated double sampling, the CCD output is sampled twice. The first sample is taken when the reset switch is turned off (e.g., at the falling edge of signal SR) and the second sample is taken after the pixel charge is dumped on to the CCD summing capacitor (e.g., at the falling edge of signal SV). These two sample points are labeled with the numbers (1) and (2) in FIG. 3. The difference between these two voltages provides the true signal. This method of taking two samples and taking their difference to remove the reset noise is referred to as correlated double sampling (CDS). CDS is useful since it eliminates the kT/C noise sampled on the CCD output capacitor as well as low frequency noise.

In order to utilize the full range of the analog-to-digital converter 22, the CCD signal range is preferably matched to the input range of the ADC. This goal requires that the CCD signal be gained (or attenuated) by the required amount. The signal range of the CCD is typically on the order of 1.5 V while, for the design example described here, the ADC range is on the order of 2.6V. Thus, a minimum gain of 2.6/1.5= 1.73 (4.78 dB) is desired in this design. In addition to this gain, the system should have between about 0 and 24 dB gain. Thus the APP 12 is specified to provide a gain of 4.78 dB to 28.78 dB at 1 dB step. Also, since the overall accuracy goal is to be accurate to about 0.05 dB, the gain steps should also be accurate to within +/−0.05 dB.

As shown in FIG. 3, the CCD output is single ended, going to most positive during reset and then coming down an amount that depends on the strength of the optical signal received. In the preferred embodiment, this input is converted to fully differential by the APP circuitry. This conversion applies a gain of 2× to optimize dynamic range. Prior to applying the gain, a DC level shifting of half the ADC input range is done. This shift is applied since the input is single ended and single sided without having a fixed common mode voltage.

The APP 12 has additional circuitry to take an analog voltage (usually provided by a DAC) and subtract it from the output. In this manner, the circuitry can cancel offset. During offset cancellation, the level shifting is suppressed to provide range for negative offsets.

The foregoing system specifications pose several challenges for the design. The issues come mainly from three requirements, namely, large gain range, high speed, and the nature of the CCD waveform. Each will now be discussed.

The goal of programmable gain amplification (PGA) requires a gain range of 4.78 dB to 28.78 dB at step of 1 dB with an accuracy of 0.05 dB around each gain point. The gain also should be linear in dB scale. These goals have been addressed by careful choice of capacitor ratios for each gain step, to achieve required accuracy with minimum loading. This goal also creates problem for amplifier design, as the amplifier close loop feedback factor changes over a wide range, creating stability problems. This problem has been addressed by changing the amplifier open loop gain and bandwidth with PGA gain using digital control.

Figure 6:
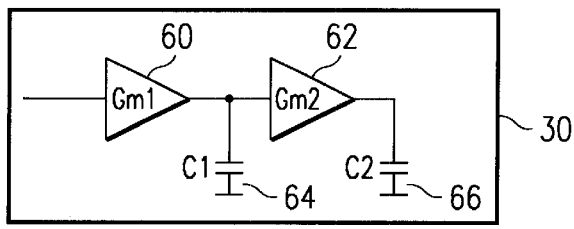
FIG. 6 shows a two-stage amplifier.

The goal of having high speed has been addressed by choosing a cascaded 2 stage amplifier topology. This amplifier is described in greater detail below (see e.g., FIGS. 6–8 and related text).

As discussed above, the CCD waveform is preferably sampled using correlated double sampling. Since the preferred embodiment implements this technique using a single amplifier stage, the architecture requires the amplifier to operate over a large input common mode range. To reduce the effect, an inverter has been used as a common mode amplifier to counter the input common mode swing. A pre-amplifier section that is capable of handling wide swing is preferably used. Also, capacitive coupling is used within stages to interface the pre-amplifier with the following main amplifier.

A first embodiment of the analog pre-processor 20 will now be described with respect to FIG. 4. An amplifier 30 preferably comprises an operational amplifier, for example a single operational amplifier including two amplifier stages. A first sampling capacitor 32 is coupled between a negative input node of the amplifier 30 and an analog signal node, labeled in FIG. 4 as CCD IN since it is coupled to the output of the CCD 12 in the preferred embodiment. A second sampling capacitor 34 is coupled between the positive input node of amplifier 30 and a reference voltage node (e.g., ground). In the preferred embodiment, the sampling capacitors 32 and 34 are variable capacitors. In an alternate embodiment, the analog input (e.g., CCD IN) could be coupled to the positive input node while the reference node is coupled to the negative input node.

Feedback capacitors 36 and 38 are coupled between the input and output nodes of amplifier 30. For example, feedback capacitor 36 is coupled between the negative input node and positive output node and feedback capacitor 38 is coupled between the positive input node and the negative output node. Hold switches 40 and 42 are coupled in the respective paths of feedback capacitors 36 and 38. While illustrated between the feedback capacitor 36 (38) and the positive (negative) output node, it is understood that the switch 40 (42) could alternatively be disposed between the feedback capacitor 36 (38) and the negative (positive) input node. Switches 40 and 42 are preferably n-channel MOS transistors.

The APP 20 can be reset by use of switches 44, 46, 48 and 50. These switches are also preferably n-channel MOS transistors. Accordingly, switches 44 and 48 are arranged to selectively couple the two plates of feedback capacitor 36 to an input common mode node $V_{INCM}$. Similarly, switches 46 and 50 are arranged to selectively couple the two plates of feedback capacitor 38 to the input common mode node $V_{INCM}$.

The manner in which the CDS functions can be implemented will now be described with respect to FIG. 4. During reset, the signals S and SP cause their corresponding switches (48 and 50 for signal S and 44 and 46 for signal SP) to be ON (i.e., conductive). During this period, the CCD output is sampled on the sampling capacitors 32 and 34. These switches 44, 46, 48 and 50 are then turned OFF (i.e., rendered non-conductive) at the falling edge of signal SP (for switches 44 and 46) and signal S (for switches 48 and 50). The falling edge of signal SP occurs just before the falling edge of signal S. At this time, the sampling capacitors 32 and 34 continue to be connected to the CCD output (CCD IN) and the amplifier 30 enters the HOLD mode since switches 40 and 42 are turned ON. The amplifier output OUTP, OUTM now follows the change in the CCD output. The output voltage, at the end of the HOLD period, will be the difference of that CCD output voltage sampled at that falling edge of signal SR and again at the falling edge of signal SV (see FIG. 3).

Figure 5:
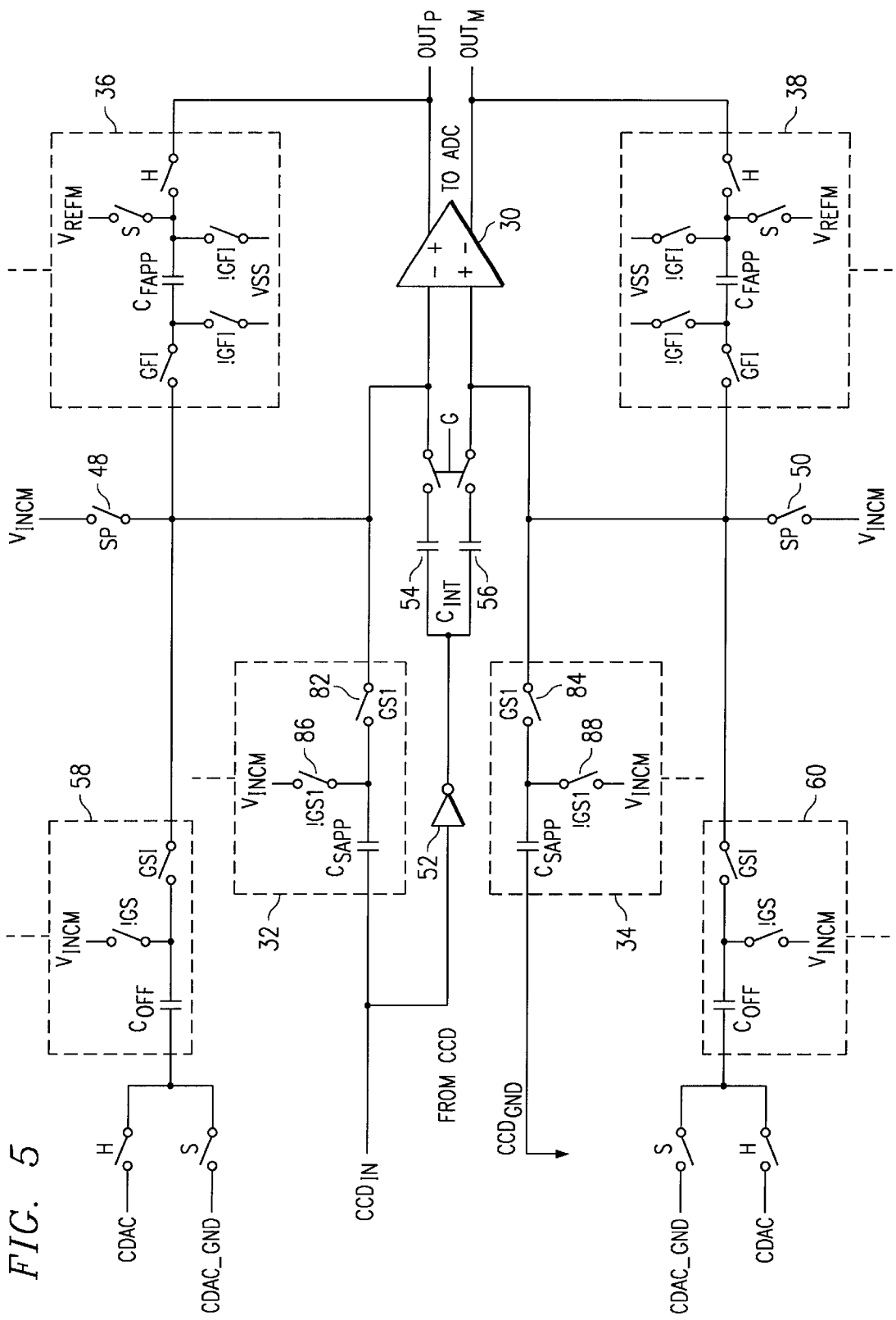
FIG. 5 shows a second embodiment pre-processor.

Since the CCD output is single ended, the sampling capacitor 34 is always grounded. The negative input of the amplifier 30 is brought out at the pin and connected through capacitor 34 to the CCD ground pin (not shown). This way, the amplifier input is made pseudo differential and most of the noise picked up gets cancelled out. The amplifier 30 output is set to a fixed common mode by a separate output common mode loop. Thus, the output is differential around a fixed common mode, though the input is single ended. To take care of the increased dynamic range, an inherent gain of 2× is provided by the stage. A more specific implementation of a preferred embodiment APP circuit is shown in FIG. 5.

To obtain programmable gain, a number of capacitors are connected in parallel to serves as sampling capacitors (Csapp) 32 and 34 and feedback capacitors (Cfapp) 36 and 38. Using a number of capacitors allowed the effective capacitor to be variable. To simplify the drawings, only one such capacitor is shown in each instance but it is understood that any number of capacitors and corresponding switches can be included. Resolution can be increased by including a larger number of capacitors for each variable capacitor 32, 34, 36 and/or 38.

The gain is given by Csapp/Cfapp. To select these capacitors 32 and 34, switches 82 and 84, respectively, are provided at the plate nearest the amplifier 30 input node. While this location is not required, it is preferred since this node sees a constant voltage, and hence has a constant switch resistance irrespective of the input voltage. On the other hand, if the switches 82 and 84 are placed on the input side, the resistance would be signal dependent and would cause some degree of distortion. If the capacitor 32 or 34 is not selected, it is connected to a fixed voltage source $V_{INCM}$ by switch 86 or 88. As noted above, the dotted lines extending from each capacitor 32, 34 is intended to signify that any number of capacitors can be used. For each of the capacitors, the respective switch 82–88 will independently controllable. Thus the CCD sees a fixed load irrespective of the gain. The amplifier also sees a fixed load.

Unique ratios of capacitors are used to generate gain linear in dB scale. The capacitors 32, 34, 36 and 38 are preferably implemented as a square matrix of unit cells to improve matching accuracy. The capacitor values can be chosen through a software program. The algorithm has the following features

- For each k between 0 and 24, generate Cs(k)/Cf(k) within given accuracy
- Minimize max(Cs(k)) and max(Cf(k))
- Keep the change of capacitance between adjacent step (Cs(k+1)−Cs(k)) as low as possible to improve matching.

A disadvantage of the APP configuration described thus far is that the amplifier 30 input common mode changes with the signal swing. Due to this variation, the amplifier should have a large input common mode range. The situation is worse for large input signal swing (low gain). To reduce this effect, an inverter 52 can be used for low gain settings as an inverting common mode amplifier. The inverter 52 drives common mode capacitors (Cint) 54 and 56. Thus, when the input swing is large, the resultant common mode movement is countered by the inverter 52 output. Since this output need not be linear, an inverter 52 suffices as an amplifier. Since the amplifier 30 is designed to work at higher gain setting, the reduced bandwidth is still sufficient for settling.

To obtain the offset cancellation, additional capacitors (Coff) 58 and 60 are provided. In digital camera systems, for example, the DSP (or additional digital circuitry in the AFE chip) measures the offset of the channel by observing the ADC output. This digital value is then converted into an analog voltage using a DAC (not shown) and subtracted in the analog domain. Here, the DAC output CDAC is fed to the Coff capacitors, thus subtracting the offset at the APP output.

During the SR phase, these capacitors 58 and 60 are shorted (zero input differential). During the hold phase, the Coff capacitors 58 and 60 sample the offset DAC (not shown). The reason for this is that the hold phase is much longer, hence the coarse DAC has much more time to settle. Since the voltage subtracted should be independent of gain, a number of capacitors are provided such that Ccoff/Csapp is constant.

The ADC 22 converts analog signals to digital signals. The analog voltage range is defined by the two voltage references Vrefp and Vrefm (this is generated on-chip). Thus for input Vin=(Vrefp−Vrefin), ADC output is maximum (all 1's, in digital terms) and for input Vin=−(Vrefp−Vrefm), ADC output is minimum (all 0's). Note that the ADC is fully differential, hence Vin=(INP−INM), which goes both positive and negative.

In the embodiment of FIG. 5, the feedback capacitors 36 and 38 (Cfapp) are not connected to a common voltage $V_{incm}$ during sampling. Instead they are connected to voltage node $V_{REFP}$, $V_{REFM}$. This provides the required level shift. During offset cancellation loop, the level shift is turned OFF by connecting the feedback capacitors to common mode.

The overall transfer function for the APP is given by $$V_{CDS} = (V_{VIDEO} - V_{RESEt}) \cdot \frac{Csapp}{Cfapp} - \frac{C_{OFF}}{Cfapp} \cdot V_{CDAC} - \Delta V_{REF}$$

where $\Delta V_{REF} = V_{REFP} - V_{REFM}$.

The load seen by the amplifier is a parallel combination of (1) the feedback capacitance Cfapp in series with parallel combination of the sampling capacitance Csapp, the DAC capacitance Cdac, and parasitic capacitance Cpar; (2) ADC sampling capacitor in parallel with input capacitance of comparators; and (3) amplifier's output parasitic capacitance. This is a varying load with gain. For lower gains, feedback capacitance Cfapp is comparable to sampling capacitance Csapp, resulting in higher capacitive load. Effective capacitive load falls with gain as Cf gets smaller.

For the preferred embodiment design, assuming 12 bit settling, the closed loop bandwidth requirement is about 53 MHz. The maximum analog gain is 28.78 dB. This corresponds to a closed loop feedback factor of 35.2 (along with parasitics of the present design), which corresponds to 31 dB.

The DC gain for a twelve-bit corresponds to about 72 dB. Since the feedback factor is 31 dB, a DC gain of about 72+31=103 dB is sufficient. A DC gain lower then this would mean the amplifier needs to be designed such that the gain with output swing needs to be linear to 12-bit.

Several amplifier architectures can be used to implement the circuitry of the present invention. Some of these possibilities will now be discussed.

In one embodiment, a single stage amplifier with the compensation capacitor being the load capacitor is used. This embodiment is not preferred, however, because the required DC gain of 103 dB is difficult to achieve. Also the unity gain-bandwidth is very high, on the order of 1.86 GHz. This leads to some difficult to realize design constraints.

Another embodiment utilizes a two-stage Miller compensated amplifier. This option is certainly a lower power solution compared to a single stage design, but still has some disadvantages. For example, the bandwidth is provided by only one stage. In addition, most of the power is consumed to get the phase margin. This solution is also less preferred since an increase in load capacitance can affect the settling performance and it is difficult to handle varying load and gain requirements.

The preferred embodiment utilizes a cascaded architecture. This architecture was found to be most suitable to handle the tight constraints. The architecture is discussed in detail below and is shown conceptually in FIG. 6. The cascaded amplifier comprises a two stage amplifier including an input stage (pre-amplifier stage) 60 and an output stage (main amplifier stage or gain stage) 62. Capacitors 64 and 66, typically parasitic capacitances, are illustrated to symbolize the loading at these nodes.

Figure 7:
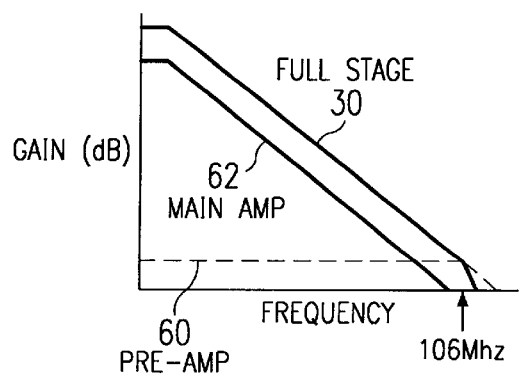
FIG. 7 shows the amplifier characteristics of the two stages.

The characteristics of the individual amplifier stages 60 and 62 and the overall amplifier 30 are shown in FIG. 7. To obtain stability, the first non-dominant pole should be at least at 2*fcl (106 MHz in this example). The first stage 60 is essentially a pre-amplifier and the second stage 62 is the main gain providing amplifier. The pre-amplifier stage 60 is designed such that its dominant pole is at 2*fcl. The non-dominant pole of the main amplifier is placed at a much higher frequency. Since the PGA range is wide, the pre-amplifier gain is varied to ensure stability. Pre-amplifier gain is flat up to 106 Mhz across all gains. The gain at 53 Mhz is the product of the gain provided by each amp at that frequency. According to specification followed in developing the preferred embodiment, this gain is required to be 31 dB.

Figure 8A:
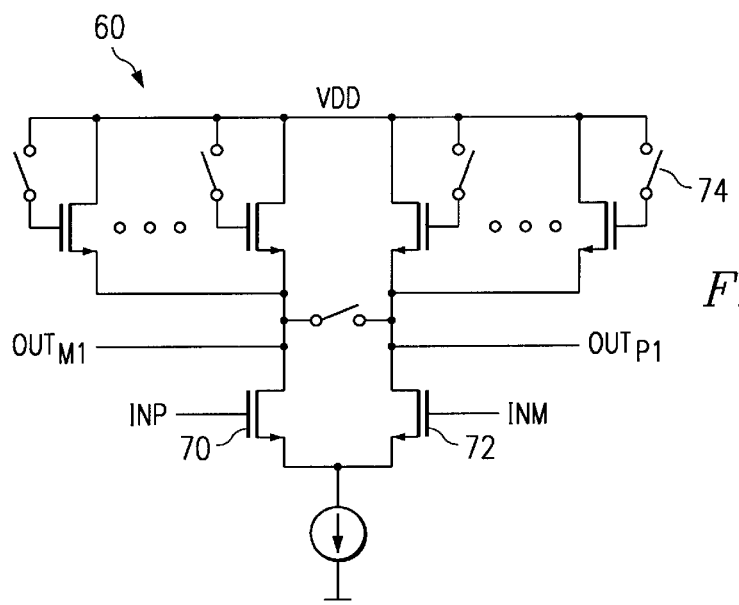
FIGS. 8a–8c show a more detailed implementation of a preferred embodiment two-stage amplifier.
Figure 8B:
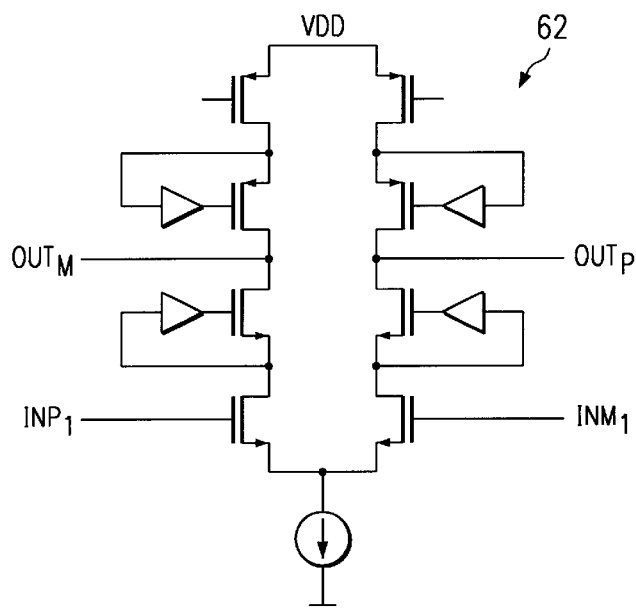
Figure 8C:
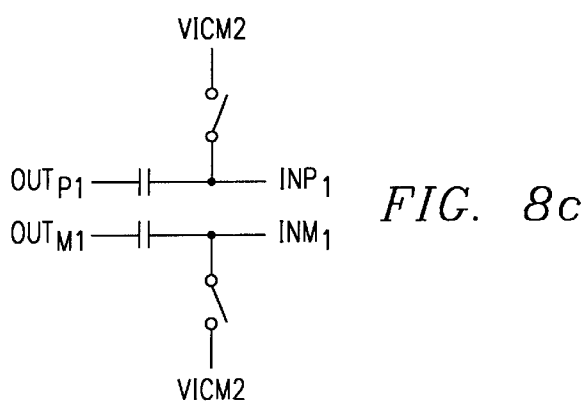

The complete amplifier is shown in FIGS. 8a–8c, where FIG. 8a shows the pre-amplifier or input stage 60, FIG. 8b shows the main amplifier or output stage 62, and FIG. 8c shows the AC coupling between the two stages 60 and 62.

Referring first to FIG. 8a, the pre-amplifier stage includes an NMOS input 70, 72. The NMOS diode load pre-amplifier architecture 74 is chosen as it satisfies a number of design goals. The stage has high bandwidth (only NMOS in signal path). The stage provides easily controllable variable gain for different PGA gain settings to ensure stability of structure. With an NMOS input and NMOS load, the gain remains controlled across process corners. The unity gain bandwidth (UGB) also tracks well. The gain is controlled digitally by bringing in extra diodes as shown in FIG. 8a. The stage also provides high input common mode range, which can be important since signal common mode varies over a wide range.

Referring to FIG. 8b, the main amplifier stage 62 provides for most of the amplifier's gain and some bandwidth. In the preferred embodiment, a regulated telescopic amplifier is used as it uses an all N-channel signal path for best speed and gain performance.

As shown in FIG. 8c, AC coupling is utilized to couple the first stage 60 and the second stage 62. To maximize the output swing, an optimal input common-mode voltage (VICM2) is utilized for the main amplifier. Unfortunately, this voltage is not equal to the output common mode voltage of the previous stage, i.e., the pre-amplifier stage. To de-couple these, the first stage output is capacitively coupled to the main amplifier stage input.

Figure 9:
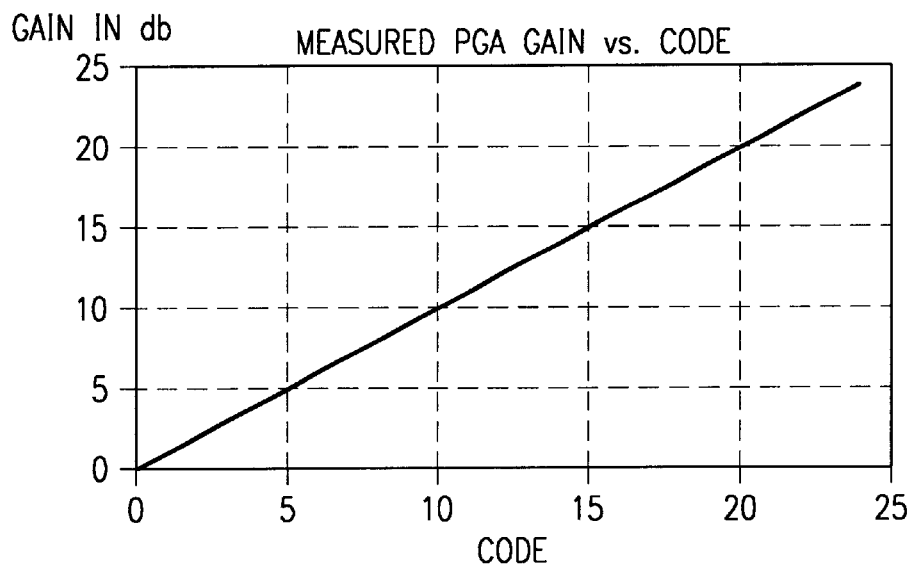
FIGS. 9 and 10 illustrate the gain performance of the analog pre-processor.
Figure 10:
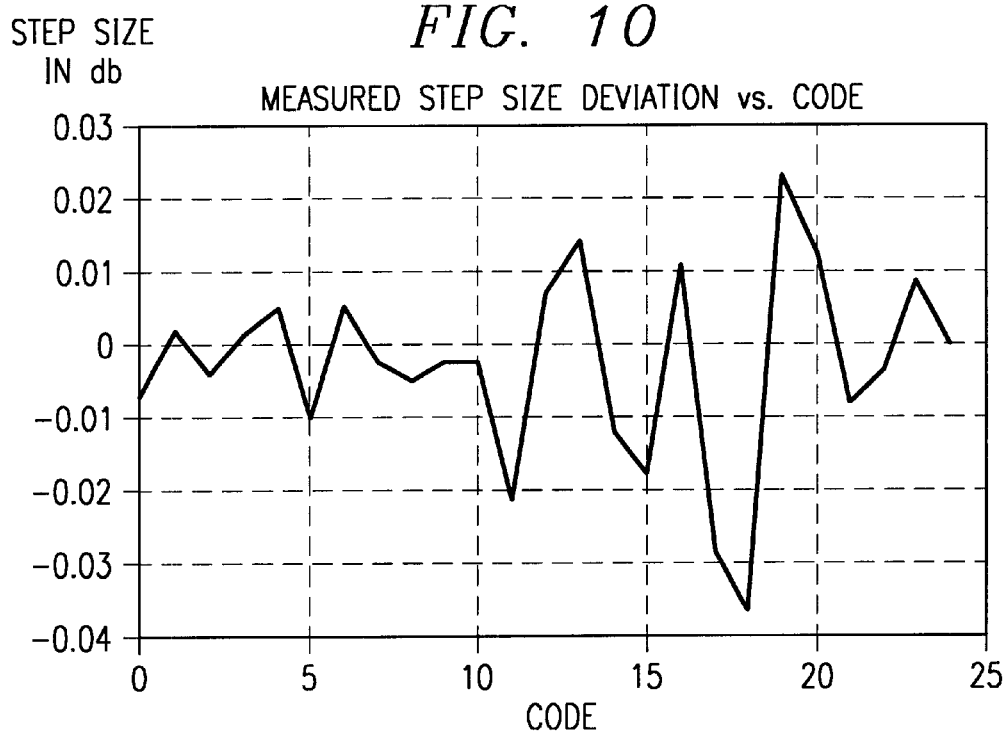

Results of a test version of the analog pre-processor of the preferred embodiment are shown in FIGS. 9 and 10. The PGA gain linearity has been found to be within +/−0.4 dB, less than the goal of +/−0.5 dB. FIG. 9 shows the measured gain as a function of digital code. The deviation of measured PGA gain from ideal gain is shown in FIG. 10.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A digital imaging device comprising:

a light sensor including an optical input and an analog electrical output;

an analog pre-processor including an analog input and an analog output, the analog input coupled to the analog electrical output of the light sensor, the analog pre-processor including an amplifier;

an analog-to-digital converter including an analog input and a digital output, the analog input of the analog-to-digital converter coupled to the analog output of the analog pre-processor; and a digital processing circuit including a digital input coupled to the digital output of the analog-to-digital converter, wherein the amplifier includes a positive input node, a negative input node, a positive output node and a negative output node, the analog pre-processor further comprising:

a first variable capacitor coupled between the negative input node and the analog electrical output of the imaging device;

a second variable capacitor coupled between the positive input node and a reference voltage node;

a third variable capacitor coupled between the positive input node and the negative output node;

a fourth variable capacitor coupled between the negative input node and the positive output node;

a first switch coupled in series with the third variable capacitor and between the negative input node and the positive output node;

a second switch coupled in series with the fourth variable capacitor and between the negative input node and the positive output node;

an inverter having an output and having an input coupled to the analog electrical output of the imaging device;

a first common mode capacitor coupled between the output of the inverter and the negative input node; and a second common mode capacitor coupled between the output of the inverter and the positive input node.

* * * * *